United States Patent
Deboes et al.

(10) Patent No.: US 7,630,464 B1
(45) Date of Patent: Dec. 8, 2009

(54) ANALOG-TO-DIGITAL SYSTEMS AND METHODS

(75) Inventors: Frederic Deboes, Austin, TX (US); John Pacourek, Austin, TX (US); Tom Cook, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 598 days.

(21) Appl. No.: 11/109,301

(22) Filed: Apr. 19, 2005

(51) Int. Cl.
    H03D 1/04 (2006.01)
    H03M 1/06 (2006.01)
    H03M 1/12 (2006.01)

(52) U.S. Cl. .................. 375/346; 341/118; 341/155

(58) Field of Classification Search ......... 375/345–346, 375/317–319; 327/74, 306, 307, 65, 87, 327/317–318; 341/118, 120, 126, 155–156, 341/164–165, 169
    See application file for complete search history.

(56) References Cited

U.S. PATENT DOCUMENTS

| | | | | |
|---|---|---|---|---|
| 5,032,744 | A * | 7/1991 | Wai Yeung Liu | 327/55 |
| 5,122,800 | A * | 6/1992 | Philipp | 341/156 |
| 5,430,765 | A * | 7/1995 | Nagahori | 375/318 |
| 5,789,974 | A * | 8/1998 | Ferguson et al. | 330/2 |
| 5,892,374 | A * | 4/1999 | Fiedler | 327/65 |
| 6,396,430 | B1 * | 5/2002 | Li | 341/155 |
| 6,429,697 | B1 * | 8/2002 | Amazeen et al. | 327/87 |
| 6,469,547 | B1 * | 10/2002 | Rabii | 327/74 |
| 6,597,303 | B2 * | 7/2003 | Cosand | 341/165 |
| 6,677,880 | B2 * | 1/2004 | Yamamoto | 341/169 |
| 6,724,839 | B1 * | 4/2004 | Chan et al. | 375/346 |
| 6,744,826 | B2 * | 6/2004 | Rabii | 375/318 |
| 7,145,494 | B2 * | 12/2006 | Mizuguchi et al. | 341/155 |
| 7,245,169 | B2 * | 7/2007 | Kishii | 327/307 |
| 7,362,246 | B2 * | 4/2008 | Park et al. | 341/118 |
| 2003/0006920 | A1 * | 1/2003 | Mori | 341/118 |
| 2004/0121735 | A1 * | 6/2004 | Tseng et al. | 455/75 |
| 2004/0227651 | A1 * | 11/2004 | Furuichi | 341/120 |

OTHER PUBLICATIONS

Lattice Semiconductor Corporation, In-System Programmable Power Supply Sequencing Controller and Monitor, ispPAC-POWR1208, Aug. 2004, pp. 1-34.

Lattice Semiconductor Corporation, In-System Programmable Power Supply Sequencing Controller and Monitor, ispPAC-POWR604, Aug. 2004, pp. 1-29.

* cited by examiner

*Primary Examiner*—Khanh C Tran
(74) *Attorney, Agent, or Firm*—Haynes and Boone, LLP

(57) ABSTRACT

Systems and methods are disclosed herein to provide analog-to-digital interface techniques. For example, in accordance with an embodiment of the present invention, an integrated circuit includes an offset cancellation circuit provides offset cancellation for input signal paths under control of at least a first clock signal. A comparator, coupled to the offset cancellation circuit, provides an output signal based on a comparison of input signals provided on the input signal paths. A register receives the output signal and provides the output signal to a digital circuit under control of a first control signal, wherein the at least first clock signal is synchronized to a clock signal of the digital circuit.

15 Claims, 3 Drawing Sheets

US 7,630,464 B1

ANALOG-TO-DIGITAL SYSTEMS AND METHODS

TECHNICAL FIELD

The present invention relates generally to electrical circuits and, more particularly, to analog/digital interfaces and metastability reduction techniques.

BACKGROUND

Electrical circuits and various electrical devices may be susceptible to generating metastable output signals (e.g., an undefined, invalid, or mistimed output signal or one that requires an indeterminate amount of time to generate a valid output). For example, metastability issues may arise in mixed-signal systems (e.g., one or more integrated circuits) that include analog circuitry that interfaces with a digital circuit (e.g., a programmable logic device (PLD)) to form an analog-to-digital interface.

In general, for the above example, the PLD may be synchronized with the main system clock. However, the analog circuitry may not be synchronized. Consequently, metastability-induced erroneous operation may occur as the analog circuitry may provide output signals that change state randomly with respect to the main system clock of the PLD. The metastability issues may interfere with regular system operation and may lead to overall system failure in worst-case situations. As a result, there is a need for improved analog/digital interface techniques.

SUMMARY

In accordance with one embodiment of the present invention, an integrated circuit includes an offset cancellation circuit adapted to provide offset cancellation for input signal paths under control of at least a first clock signal; a comparator, coupled to the offset cancellation circuit, adapted to provide an output signal based on a comparison of input signals provided on the input signal paths; and a register adapted to receive the output signal and provide the output signal to a digital circuit under control of a first control signal, wherein the at least first clock signal is synchronized to a clock signal of the digital circuit.

In accordance with another embodiment of the present invention, a system includes means for comparing input signals and providing an output signal based on a comparison of the input signals; means for providing offset cancellation for the comparing means under control of a first and a second clock signal; and means for latching the output signal and providing the output signal to a digital circuit under control of a first control signal, wherein the first clock signal is synchronized to a clock signal of the digital circuit.

In accordance with another embodiment of the present invention, a method of providing an analog-to-digital conversion for input signals to a digital circuit includes performing offset cancellation; providing the input signals; comparing the input signals and providing an output signal based on the comparing; latching the output signal; and providing the output signal to the digital circuit under control of a first control signal, wherein the first control signal is synchronized to a clock signal of the digital circuit.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
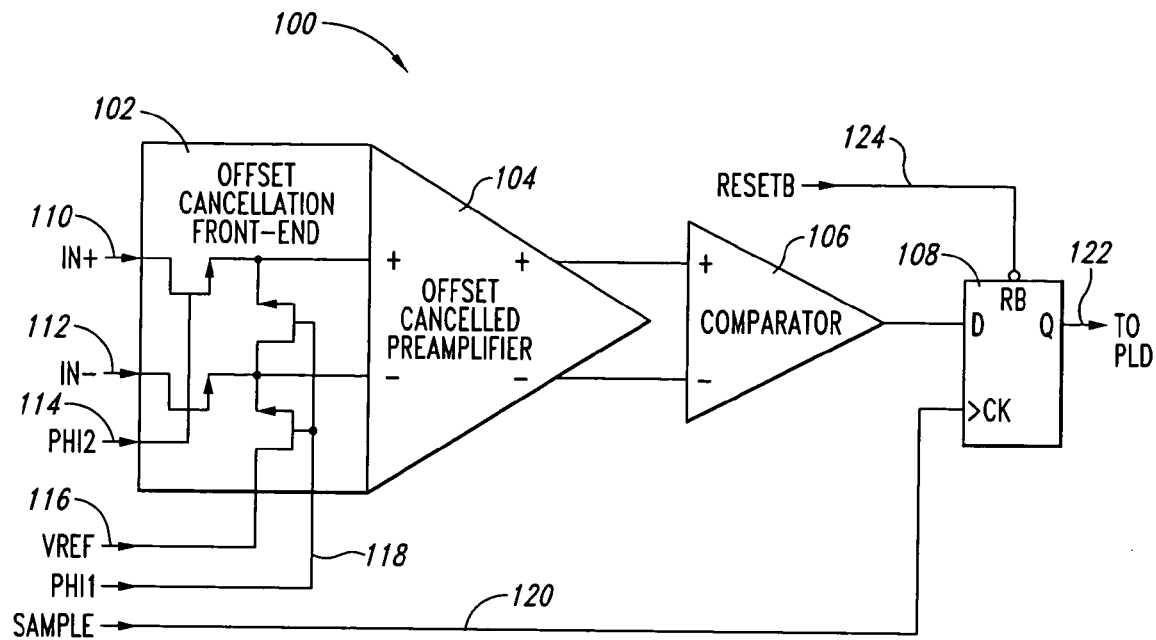
FIG. 1 shows a circuit block diagram illustrating an analog-to-digital interface in accordance with an embodiment of the present invention.

FIG. 1 shows a circuit 100 illustrating an analog-to-digital interface in accordance with an embodiment of the present invention. Circuit 100 includes an offset cancellation circuit 102, a preamplifier 104, a comparator 106, and a register 108 (e.g., a D flip flop).

Input signals 110 and 112 (labeled IN+ and IN−, respectively), clock signals 114 and 118 (labeled phi2 and phi1, respectively), and a voltage reference signal (vref) 116 are provided to offset cancellation circuit 102. A sample signal 120 (e.g., referred to as a clock signal or a control signal) and a reset signal (resetb) 124 are provided to register 108.

Input signal 110, for example, may represent a signal having a voltage to be monitored. Input signal 112, for example, may represent a reference voltage (e.g., a programmable reference voltage), with comparator 106 comparing input signal 110 to input signal 112.

Figure 2:
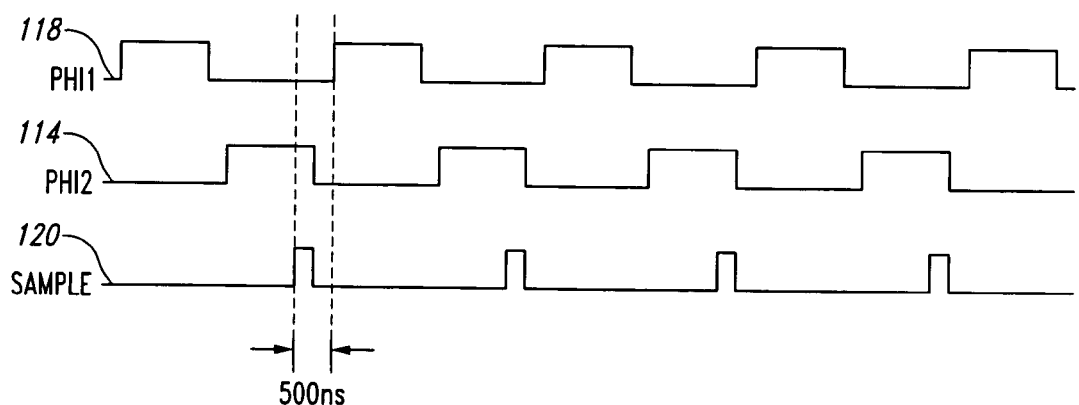
FIG. 2 shows a timing diagram illustrating certain exemplary signals, which may be associated with the circuit block diagram of FIG. 1 in accordance with an embodiment of the present invention.

Referring also to FIG. 2, a timing diagram is shown that illustrates exemplary waveforms for clock signals 114 and 118 and sample signal 120 in accordance with an embodiment of the present invention. As illustrated, clock signals 114 and 118 may represent non-overlapping clocks to control offset cancellation performed by offset cancellation circuit 102.

When clock signal 118 is asserted (e.g., a high signal level) and clock signal 114 is not asserted (e.g., a low signal level), offset cancellation circuit 102 performs offset cancellation for preamplifier 104 (with preamplifier 104 being an optional circuit element). Specifically, clock signal 114 disconnects input signals 110 and 112 (e.g., the monitored signals) from preamplifier 104, while clock signal 118 connects a positive (+) terminal and a negative (−) terminal of preamplifier 104 together (i.e., approximately shorted together) and provides a predefined reference voltage from voltage reference signal 116 to the positive and negative terminals. Conventional offset cancellation techniques may then be applied (e.g., to preamplifier 104) to achieve a reduced residual offset (e.g., a residual offset from preamplifier 104 of 1 mV as compared to 10 mV for a non-offset cancelled comparator), which may enhance overall system performance.

When clock signal 118 is not asserted and clock signal 114 is asserted, the normal comparator operations (e.g., voltage supply monitoring) by comparator 106 resumes. Specifically, clock signal 114 connects input signals 110 and 112 to preamplifier 104, while clock signal 118 disconnects the positive (+) terminal and the negative (−) terminal of preamplifier 104 from each other and from voltage reference signal 116.

An output signal from comparator 106 is sampled (e.g., latched) by register 108, which provides an output signal 122 under control of sample signal 120. Output signal 122 may be provided to a digital circuit or other digital device (e.g., a PLD).

As illustrated in FIG. 2, sample signal 120 may control register 108 to sample the output signal from comparator 106 during the period that clock signal 114 is asserted and clock signal 118 is not asserted. For example, sample signal 120 may be asserted a specific time period (e.g., 500 ns as shown in FIG. 2 and as discussed further herein) before clock signal 118 is asserted. Furthermore, clock signal 118 may be provided to or received from the digital system receiving output signal 122 (e.g., clock signal 118 in some fashion may be synchronized with the clock providing timing for the digital system). Thus, circuit 100 will be synchronized with the digital system and, by controlling the time period between the assertion of sample signal 120 and the assertion of clock signal 118, compensation may be provided for various propagation delays and allow sufficient time to resolve any remaining metastable states before the digital system (e.g., the PLD) refreshes its state. This cycle of offset cancellation and sampling may then be repeated, as illustrated in FIG. 2.

Thus, the asynchronous analog and synchronous digital system problem is solved by recognizing that the digital system, clocked at periodic time intervals, may be viewed as sampling the analog signal. Therefore, to minimize the probability of metastability-induced erroneous operation, one solution, in accordance with an embodiment of the present invention, is to modify the analog module to change it into a sampled-data system and synchronize its operation with that of the digital system (e.g., the PLD or, specifically, the macrocells of the PLD utilizing values from output signal 122).

In general, in accordance with an embodiment of the present invention, circuit 100 may be viewed as an analog/digital interface having an offset-cancelled comparator front end driving a register (e.g., a D flip flop) back end, with circuit 100 controlled by three clocks (or phases). Two of the clocks, clock signals 114 and 118, are dual non-overlapping clocks, with clock signal 118, for example, providing a clock signal (e.g., for synchronization) to the digital system receiving output signal 122. Consequently, the front end analog portion may be synchronized with the back end along with the digital system receiving output signal 122.

Figure 3:
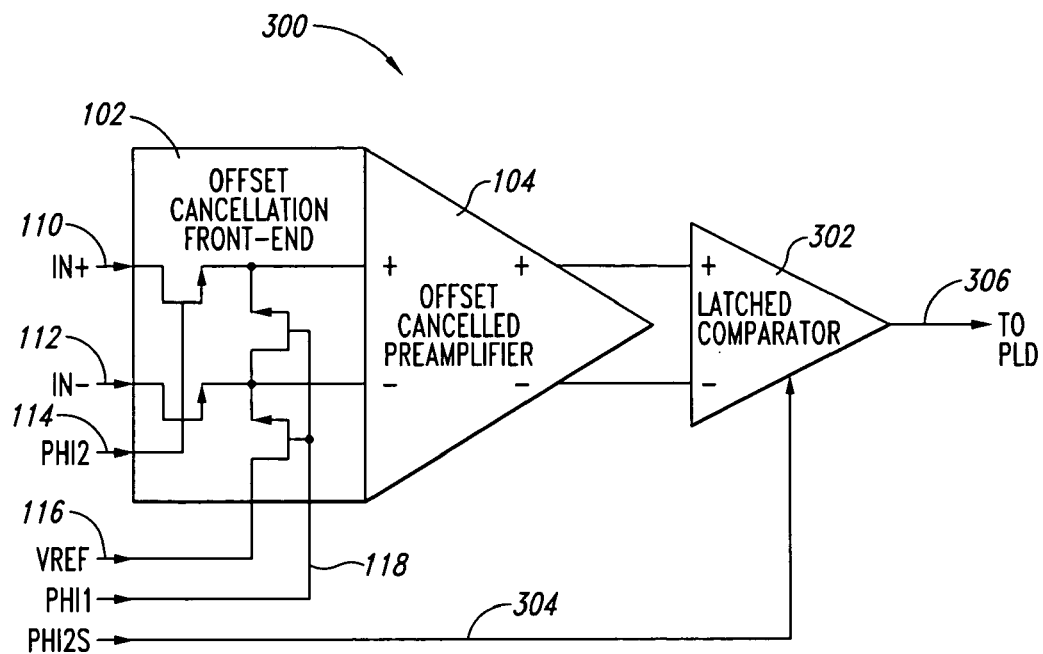
FIG. 3 shows a circuit block diagram illustrating an analog-to-digital interface in accordance with an embodiment of the present invention.
Figure 4:
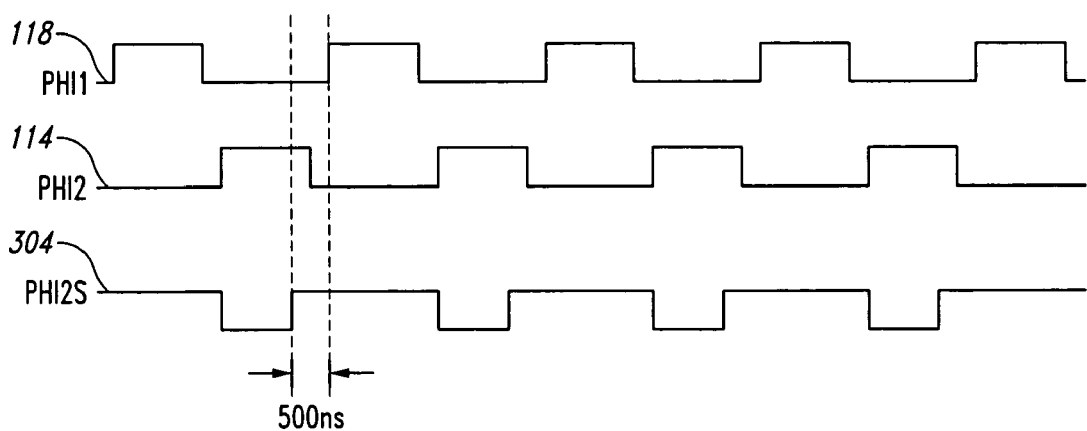
FIG. 4 shows a timing diagram illustrating certain exemplary signals, which may be associated with the circuit block diagram of FIG. 3 in accordance with an embodiment of the present invention.

FIG. 3 shows a circuit 300 illustrating an analog-to-digital interface in accordance with an embodiment of the present invention, while FIG. 4 shows a timing diagram illustrating exemplary waveforms for clock signals 114 and 118 and a clock signal 304 for circuit 300 in accordance with an embodiment of the present invention.

Circuit 300 is similar to circuit 100 (FIG. 1) and therefore the description of similar features or functions will not be repeated, but certain differences will be noted. As shown in FIG. 3, a latched comparator 302 is provided, which removes the need for register 108 (FIG. 1).

Clock signal 304 (labeled phi2s), which may be viewed as a modified version of sample signal 120 (FIG. 1), controls latched comparator 302 (including the embedded latch) for providing an output signal 306. Offset cancellation is still performed, as described above, under control of clock signals 114 and 118, with clock signal 118 received from or provided also to the digital system (e.g., a PLD) receiving output signal 306. Furthermore, clock signal 304 may be asserted a certain time period (e.g., 500 ns) before the assertion of clock signal 118, as shown in FIG. 4 and as discussed similarly with regards to sample signal 120 (FIGS. 1 and 2).

Output signal 122 (FIG. 1) or output signal 306 (FIG. 3) may be further filtered prior to or within the digital system. For example, filtering (e.g., low pass filtering) of output signal 122 or output signal 306 from the corresponding sampled data system may be performed in the digital domain prior to being transferred to the digital system.

Figure 5:
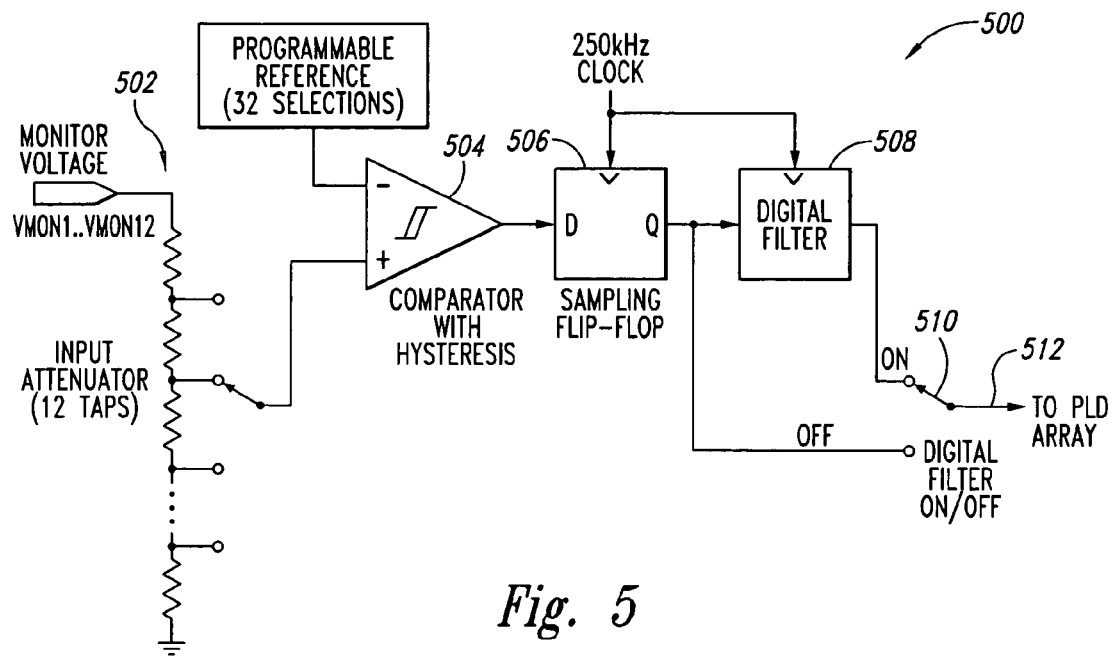
FIG. 5 shows a circuit block diagram illustrating an analog-to-digital interface in accordance with an embodiment of the present invention.

For example, FIG. 5 shows a circuit 500 illustrating an analog-to-digital interface with filtering in accordance with an embodiment of the present invention. Circuit 500 is similar to circuit 100 (FIG. 1) and therefore the description of similar features or functions will not be repeated, but certain differences will be noted.

Circuit 500 includes an input attenuator 502, a comparator 504, a register 506, a digital filter 508, and a switch 510. Input attenuator 502 receives sequentially one or more signals whose voltages are to be monitored and provides appropriately attenuated versions of these signals to comparator 504. Comparator 504 compares the signals from input attenuator 502 to one or more reference voltages and provides a result of the comparison to register 506.

An output signal from register 506 is filtered by digital filter 508, with switch 510 determining whether to provide the output signal from register 506 or a filtered version of the output signal from digital filter 508 as an output signal 512 to the digital system (e.g., a PLD). Digital filter 508, as an example, may provide poles and zeros in the z-domain, with a frequency accuracy approximate to that of the digital system's clock. Furthermore, it should be understood that the digital filtering techniques, discussed in reference to FIG. 5, may be similarly applied to circuit 100 (FIG. 1) and circuit 300 (FIG. 3).

Figure 6:
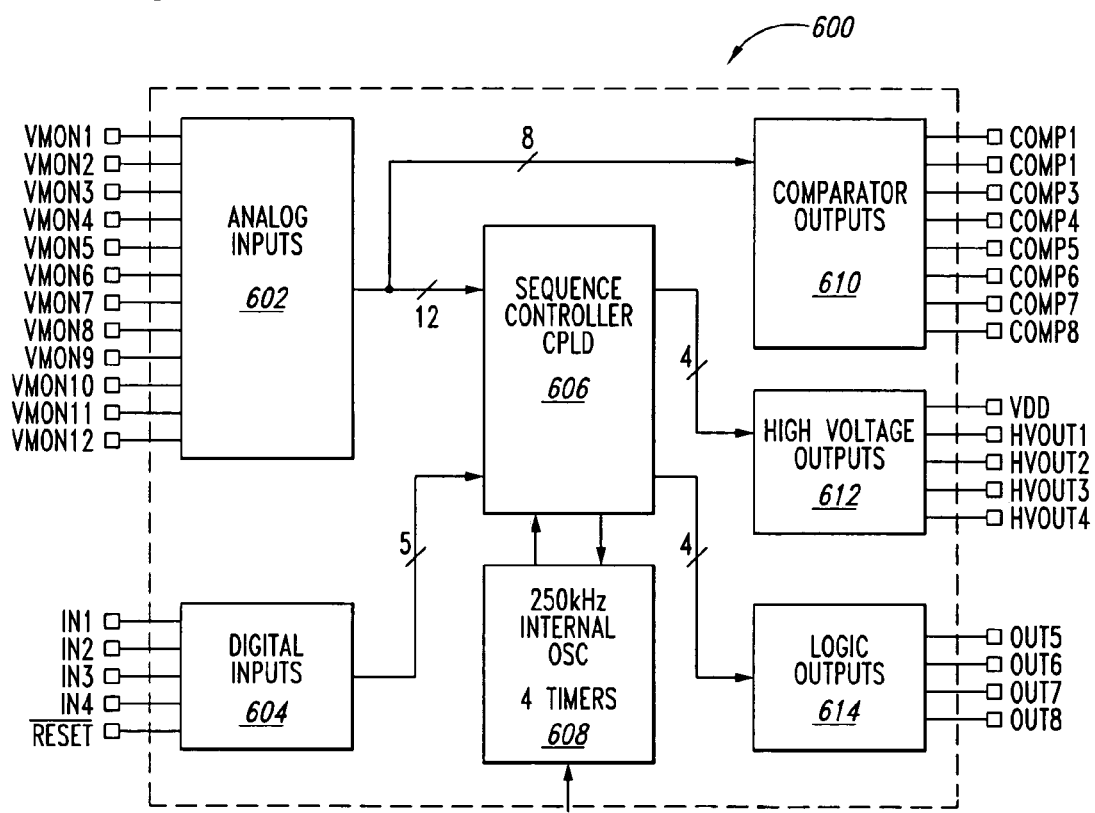
FIG. 6 shows a block diagram illustrating a system having an analog-to-digital interface in accordance with an embodiment of the present invention.

Circuits 100, 300, and/or 500 may be implemented as part of any type of integrated circuit or system. For example, FIG. 6 shows a block diagram illustrating an exemplary system 600 having one or more analog-to-digital interfaces in accordance with an embodiment of the present invention. System 600 represents a power management system (e.g., formed as a single integrated circuit) that provides power supply sequencing and monitoring.

System 600 includes an analog inputs block 602, a digital inputs block 604, a programmable logic device (PLD) 606, a timing block 608, a comparator outputs block 610, a high voltage outputs block 612, and a logic outputs block 614. Analog inputs block 602 includes one or more of circuits 100, 300, and/or 500, which monitor voltage levels of input signals (labeled VMON1 through VMON12) and provide the comparison results to PLD 606 and to comparator outputs block 610. PLD 606 (e.g., a complex programmable logic device) may be configured, for example, to implement a state machine sequence controller.

Digital inputs block 604 monitors digital signals and provides the information to PLD 606. Timing block 608 provides programmable timer functions for PLD 606. Comparator outputs block 610, high voltage outputs block 612, and logic outputs block 614 provide corresponding output signals for circuit 600, as illustrated in FIG. 6.

In general, to provide functional repeatability (e.g., obtain the same result with the same timing for every system when the same input sequence is present), metastability-induced erroneous operation may be eliminated by providing the required setup and hold time for proper macrocell operation of PLD 606. For example, sample signal 120 (FIG. 1) or clock signal 304 (FIG. 3) helps to ensure that macrocell timing requirements will be met by sampling the comparator (e.g., comparator 106 or latched comparator 302, respectively) a specified minimum time before clock signal 118 clocks the macrocells within PLD 606. For example, the minimum time generally must be greater than the maximum delay time from the input terminals of PLD 606 to its macrocells (e.g., 500 ns in the examples above).

Systems and methods are disclosed herein to provide analog-to-digital interface techniques. For example, in accordance with an embodiment of the present invention, an analog-to-digital interface is disclosed that employs an offset-cancelled comparator controlled by or synchronized with a clock associated with the subsequent digital system coupled to the interface (e.g., the PLD or other digital device receiving the result from the analog-to-digital interface).

For example, if the digital system coupled to the analog-to-digital interface is a PLD, the offset-cancelled comparators may be controlled by the PLD's clock. The output signal from the comparator may be sampled at a fixed interval prior to the PLD clocking in its next state. Thus, by providing to the PLD a sampled data input that is clocked by the same clock signal, the potentially asynchronous signals are synchronized and the probability of metastability-induced erroneous operation may be reduced.

In general, in accordance with an embodiment of the present invention, a method is disclosed to lower metastability-induced failures and increase the accuracy of the analog/digital interface in mixed-signal systems. However, simply sampling the analog signal may not be sufficient to guarantee statistical elimination of erroneous operation because, for the example above, the propagation delay to the PLD macrocells depends upon routed signal paths as well as process, supply, and temperature conditions. Consequently, it is disclosed to stage the clock signals between the analog portion and the PLD and use controlled delays to reduce or minimize metastability-induced failures. For example, a staged operation may include sampling the front-end comparator by some portion of the clock period (e.g., one-eighth of the clock period) before the macrocells of the PLD are clocked.

Furthermore, an advantage of sampled data analog front ends is that the periodic nature of the operation may be used to cancel out mismatches and other non-idealities of the analog operation to offer possibly enhanced overall system operation. For example, the dual non-overlapping clocks enable offset cancellation techniques to be added to the comparator operation. Thus, the comparators residual offset may be reduced (e.g., by one or more orders of magnitude) to minimize the offset contribution to the overall error budget and improve detection accuracy (e.g., by a factor of two or more) relative to conventional techniques.

Embodiments described above illustrate but do not limit the invention. It should also be understood that numerous modifications and variations are possible in accordance with the principles of the present invention. Accordingly, the scope of the invention is defined only by the following claims.

We claim:

1. An integrated circuit comprising:
an offset cancellation circuit adapted to provide offset cancellation for input signal paths under control of at least a first clock signal;
a comparator, coupled to the offset cancellation circuit, adapted to provide an output signal based on a comparison of input signals provided on the input signal paths;
a register adapted to receive the output signal and provide the output signal to a digital circuit under control of a first control signal, wherein the at least first clock signal is synchronized to a clock signal of the digital circuit; and
a digital filter coupled to the register, wherein the output signal to the digital circuit is selectively filtered by the digital filter.

2. The integrated circuit of claim 1, wherein the comparator and the register comprise a latched comparator, with the first control signal controlling the latched comparator.

3. The integrated circuit of claim 1, further comprising a preamplifier coupled between the offset cancellation circuit and the comparator.

4. The integrated circuit of claim 1, further comprising a preamplifier coupled between the offset cancellation circuit and the comparator, and wherein the first clock signals comprises a first and a second non-overlapping clock signal, the first non-overlapping clock signal controlling the application of a reference voltage to input terminals of the preamplifier for the offset cancellation, and the second non-overlapping clock signal controlling the application of the input signals to the input terminals of the preamplifier, with the first non-overlapping clock signal synchronized to the clock signal of the digital circuit.

5. The integrated circuit of claim 4, wherein the first control signal is asserted prior to the assertion of the first non-overlapping clock signal.

6. The integrated circuit of claim 4, wherein the first control signal is asserted prior to the assertion of the first non-overlapping clock signal, and wherein the digital circuit comprises a programmable logic device, with the first non-overlapping clock signal synchronized with the clock signal of the programmable logic device.

7. The integrated circuit of claim 1, wherein the input signals comprise a first and a second input signals and the integrated circuit further comprises:
a programmable voltage reference circuit adapted to provide a programmable reference voltage as the first input signal; and
an input attenuator adapted to programmably attenuate a signal being monitored to provide an attenuated signal of the signal being monitored as the second input signal.

8. A system comprising:
means for comparing input signals and providing an output signal based on a comparison of the input signals;
means for providing offset cancellation for the comparing means under control of a first and a second clock signal; and
means for latching the output signal and providing the output signal to a digital circuit under control of a first control signal, wherein the first clock signal is synchronized to a clock signal of the digital circuit; and
means for selectively filtering the output signal provided to the digital circuit.

9. A method of providing an analog-to-digital conversion for input signals to a digital circuit, the method comprising:
- performing offset cancellation;
- providing the input signals;
- comparing the input signals and providing an output signal based on the comparing;
- latching the output signal;
- selectively filtering the output signal provided to the digital circuit; and
- providing the output signal to the digital circuit under control of a first control signal, wherein the first control signal is synchronized to a clock signal of the digital circuit.

10. The method of claim 9, further comprising applying a voltage reference for the performing of the offset cancellation.

11. The method of claim 9, wherein the performing of the offset cancellation is controlled by at least a first clock signal synchronized to the clock signal of the digital circuit.

12. The method of claim 11, wherein the at least first clock signal comprises dual non-overlapping clock signals.

13. The method of claim 11, wherein the first control signal is asserted prior to the assertion of the first clock signal.

14. An integrated circuit comprising:
- an offset cancellation circuit adapted to provide offset cancellation for input signal paths under control of at least dual non-overlapping clock signals;
- a comparator, coupled to the offset cancellation circuit, adapted to provide an output signal based on a comparison of input signals provided on the input signal paths; and
- a register adapted to receive the output signal and provide the output signal to a digital circuit under control of a first control signal,
- wherein the offset cancellation circuit is controllable by the at least dual non-overlapping clock signals and the register is controllable by the first control signal such that the offset cancellation circuit does not provide offset cancellation for the input signal paths while the register is receiving the output signal.

15. The integrated circuit of claim 14, wherein the comparator and the register comprise a latched comparator.

* * * * *

UNITED STATES PATENT AND TRADEMARK OFFICE
CERTIFICATE OF CORRECTION

| | | |
|---|---|---|
| PATENT NO. | : 7,630,464 B1 | Page 1 of 1 |
| APPLICATION NO. | : 11/109301 | |
| DATED | : December 8, 2009 | |
| INVENTOR(S) | : Deboes et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1194 days.

Signed and Sealed this

Second Day of November, 2010

David J. Kappos
*Director of the United States Patent and Trademark Office*